United States Patent
Kraver et al.

(10) Patent No.: US 10,715,096 B1
(45) Date of Patent: Jul. 14, 2020

(54) CAPACITANCE-TO-VOLTAGE INTERFACE CIRCUIT

(71) Applicant: NXP USA, Inc., Austin, TX (US)

(72) Inventors: Keith Kraver, Gilbert, AZ (US); Sung Jo, Gilbert, AZ (US); Gerhard Trauth, Muret (FR); Marianne Maleyran, Saubens (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/782,339

(22) Filed: Feb. 5, 2020

(30) Foreign Application Priority Data

Feb. 22, 2019 (EP) ..................... 19305214

(51) Int. Cl.
*H03H 7/12* (2006.01)
*H03H 11/12* (2006.01)
(Continued)

(52) U.S. Cl.
CPC .......... *H03H 7/12* (2013.01); *H03H 11/1291* (2013.01); *H03H 19/002* (2013.01);
(Continued)

(58) Field of Classification Search
None
See application file for complete search history.

(56) References Cited

U.S. PATENT DOCUMENTS 7,305,880 B2 * 12/2007 Caminada .......... G01C 19/5726
73/504.04
8,618,816 B2 12/2013 He et al.
(Continued)

FOREIGN PATENT DOCUMENTS

WO    WO-2012/035439 A2    3/2012
WO    WO-2012/035439 A3    3/2012

OTHER PUBLICATIONS

Aaltonen, Lasse; "Integrated Interface Electronics for Capacitive MEMS Inertial Sensors"; Doctoral Dissertation, Dec. 31, 2010, pp. 1-157, Aalto University, Espoo, Finland, retrieved from the internet at http://lib.tkk.fi/Diss/2010/isbn9789526033662/isbn978952603662.pdf on May 8, 2015.
(Continued)

*Primary Examiner* — Lana N Le
(74) *Attorney, Agent, or Firm* — Charlene R. Jacobsen

(57) ABSTRACT

Systems and methods for converting a capacitance signal into a band-limited voltage signal for improved signal processing are disclosed herein. Such systems can include a capacitance-to-voltage converter configured to convert a capacitive signal from a capacitive device that operates at a mechanical frequency into a raw voltage signal, a clock generator configured to convert the mechanical frequency into one or more clock signals, and a filter component configured to apply a band-pass filter response to the raw voltage signal to convert the raw voltage signal into a band-limited voltage signal. The clock generator can be configured to apply the one or more clock signals to the filter component to drive a first pole and a second pole of the band-pass filter response to track the mechanical frequency of the capacitive device such that the geometric mean of the first pole and the second pole is substantially equal to the mechanical frequency.

20 Claims, 5 Drawing Sheets

(51) Int. Cl.
*H03H 19/00* (2006.01)
*H03M 1/12* (2006.01)

(52) U.S. Cl.
CPC ........ *H03H 19/004* (2013.01); *H03M 1/1245* (2013.01); *H03H 2210/012* (2013.01); *H03H 2210/025* (2013.01)

(56) References Cited

U.S. PATENT DOCUMENTS

| | | | | |
|---|---|---|---|---|
| 10,459,003 B2* | 10/2019 | Ono | ................. | G01L 9/12 |
| 2006/0037417 A1* | 2/2006 | Shcheglov | ......... | G01C 19/5684 |
| | | | | 74/5.4 |
| 2011/0179868 A1 | 7/2011 | Kaino et al. | | |
| 2012/0235726 A1* | 9/2012 | Elsayed | ............ | G01C 19/5776 |
| | | | | 327/299 |
| 2013/0099836 A1* | 4/2013 | Shaeffer | ............ | G01C 19/5776 |
| | | | | 327/148 |
| 2015/0226557 A1* | 8/2015 | Aaltonen | ........... | G01C 19/5712 |
| | | | | 73/504.12 |
| 2016/0003618 A1* | 1/2016 | Boser | ................. | G01C 19/5776 |
| | | | | 73/504.12 |
| 2016/0109258 A1* | 4/2016 | Boser | ................. | G01C 19/5726 |
| | | | | 73/504.12 |
| 2017/0047893 A1* | 2/2017 | Nguyen | .................... | H03L 7/18 |

OTHER PUBLICATIONS

Geen, John A. et al.; Single-Chip Surface Micromachined Integrated Gyroscope with 50 dp/h Allan Deviation;IEEE Journal of Solid-State Circuits, vol. 37, Issue 12; pp. 1860-1866.(Dec. 16, 2002).

Norouzpour-Shirazi, Arashk; "Tutorial: Interface Circuits and Systems for Inertial Sensors"; retrieved from the Internet URL:https://www.researchgate.net/publication/282293315_Tutorial_Interface_Circuits_and_Systems_for_Inertial_Sensors on Jul. 15, 2019); 54 pages (Nov. 3, 2013).

Zumbahlen, Hank, "Chapter 5—Analog Filters", Op Amp Applications Handbook, editor Walt Jung, Dec. 31, 2005; Newness/Elsevier, Amsterdam, NL; 14 pages.

* cited by examiner

CAPACITANCE-TO-VOLTAGE INTERFACE CIRCUIT

CROSS-REFERENCE TO RELATED APPLICATIONS

This application claims the priority under 35 U.S.C. § 119 of European patent application no. 19305214.9, filed Feb. 22, 2019 the contents of which are incorporated by reference herein.

FIELD

Embodiments of the subject matter described herein relate generally to interface circuits for capacitive devices and related methods of operation.

BACKGROUND

A capacitive device such as a Coriolis-based gyroscope transducer, outputs a capacitive signal indicative of measurements or other properties of the capacitive device. Subsequent signal conditioning for such devices can be more efficient by first converting the capacitance signal to a voltage signal. For an example of a Coriolis-based gyroscope transducer, the capacitance signal can be an amplitude modulated signal that occupies a narrow range of frequencies around the mechanical resonance of a "Drive" element of the gyroscope. An envelope of the amplitude modulated signal can correspond to a desired signal and an amplitude modulated demodulator can extract the envelope of the signal.

However, several sources of error can corrupt extraction of the desired signal. Non-zero delay in the signal conditioning path prior to demodulation can cause signal leakage. Leakage on the sensitive sense nodes (e.g., the input to an interface circuit for converting the capacitance signal) can reduce the output range of the circuit. Both leakage and delay often depend on temperature such that leakage compensation and delay can be competing performance metrics. One known approach employs a resistor feedback in conjunction with a capacitance-to-voltage circuit to process the capacitance signal. However, this method requires a large value resistor to produce a small phase error, which makes the capacitance-to-voltage conversion more susceptible to leakage. Generally, known capacitance-to-voltage conversion interface circuits are susceptible to high noise, electromagnetic radiation and/or electrical fields.

In view of the above, there is a need for capacitance-to-voltage interface circuits and related methods of operation that address one or more of the above concerns, or other concerns, associated with capacitance-to-voltage interface circuits, and/or provide one or more advantages by comparison with known capacitance-to-voltage interface circuits.

SUMMARY

According to a first aspect of the present disclosure there is provided a capacitance to voltage interference circuit as defined in claim 1.

According to a second aspect there is provided a method as defined in claim 10.

According to a third aspect there is provided a system comprising: a capacitive device that operates at a mechanical frequency and outputs a capacitive signal; a capacitance-to-voltage converter electrically coupled to the capacitive device and configured to convert the capacitive signal into a raw voltage signal; a clock generator electrically coupled to the capacitive device and configured to convert the mechanical frequency into one or more clock signals; a filter component electrically coupled to the capacitance-to-voltage converter and the clock generator and configured to apply a band-pass filter response to the raw voltage signal to convert the raw voltage signal into a band-limited voltage signal; and an analog-to-digital converter electrically coupled to an output of the filter component and the clock generator that down samples the band-limited voltage signal for later digital signal processing, wherein the clock generator is configured to apply the one or more clock signals to the filter component to drive a first pole and a second pole of the band-pass filter response to track the mechanical frequency of the capacitive device such that the geometric mean of the first pole and the second pole is substantially equal to the mechanical frequency.

DETAILED DESCRIPTION

The present disclosure relates, in at least some embodiments, to systems and methods for converting a capacitance signal into a band limited voltage signal for improved signal processing with reduced phase error without trim and with low noise, increased leakage tolerance, and rejection of electromagnetic interference. Specifically, in some embodiments, the disclosed systems and methods include a hybrid discrete-time/continuous-time signal-chain path that implements a band-pass filter (BPF) having center frequency that tracks the mechanical Drive frequency of a capacitive device that provides the capacitance signal. Elements of the signal chain in order of signal flow include a continuous-time capacitance-to-voltage circuit with an included biasing circuit which also serves as a discrete-time high-pass filter (HPF), a continuous-time anti-aliasing filter, and a discrete-time low-pass filter (LPF). The HPF and LPF elements together form the BPF.

The present disclosure also relates, in at least some embodiments, to a method and architecture whereby a feedback network used to bias a charge integrator forms a high-pass pole in a signal transfer function and the high-pass pole is related in frequency to a low-pass pole such that total phase error in the system or circuit is small. The two poles can be implemented such that the frequency when the phase is zero tracks a drive frequency of a capacitive device providing a capacitive input to the system or circuit (e.g., a center of a desired signal band).

Figure 1:
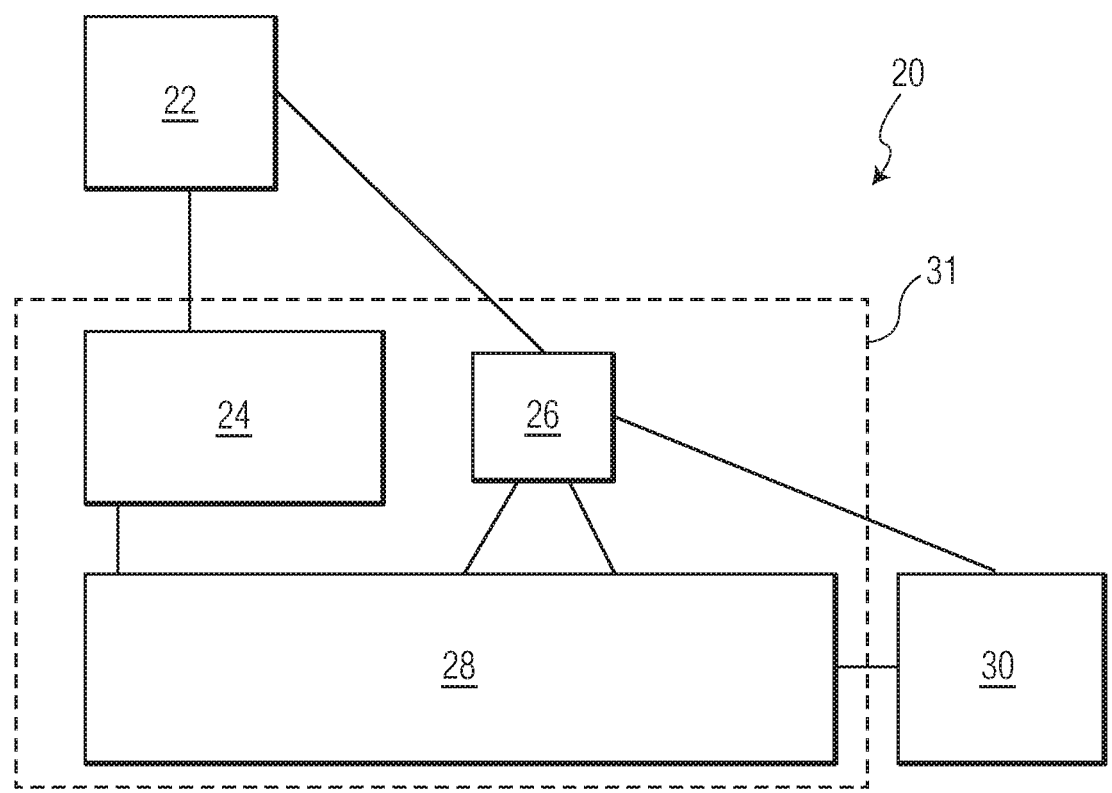
FIG. 1 is a schematic diagram of a capacitance-to-voltage conversion and amplification system, in accordance with an example embodiment.

FIG. 1 is a schematic diagram of a capacitance-to-voltage conversion and amplification system 20, in accordance with an example embodiment. As shown in FIG. 1, the capacitance-to-voltage conversion and amplification system 20 can include a capacitive device 22, a capacitance-to-voltage converter 24 electrically coupled or configured to electrically couple to the capacitive device 22, a clock generator 26 electrically coupled or configured to electrically couple to the capacitive device 22, a filter component 28 electrically coupled to the capacitance-to-voltage converter 24 and the clock generator 26, and an analog-to-digital converter 30 electrically coupled to an output of the filter component 28 and the clock generator 26. In some embodiments, the capacitance-to-voltage converter 24, the clock generator 26, and the filter component 28 can form a capacitance-to-voltage interface circuit 31. In some embodiments, the clock generator 26 can include a phase-locked loop component which generates the one or more clock signals from a mechanical frequency of the capacitive device 22, which can remove the need for tuning circuitry or trimming of the center frequency.

In operation, in some embodiments, the capacitive device 22 can operate at the mechanical frequency ($f_d$) and output a capacitive signal. The capacitance-to-voltage converter 24 can be configured to convert the capacitive signal from the capacitive device 22 into a raw voltage signal. The clock generator 26 can be configured to convert the mechanical frequency into one or more clock signals. The filter component 28 can be configured to apply a band-pass filter response to the raw voltage signal to convert the raw voltage signal into a band-limited voltage signal. In some embodiments, the clock generator 26 can be configured to apply the one or more clock signals to the filter component 28 to drive a first pole and a second pole of the band-pass filter response to track the mechanical frequency of the capacitive device 22 such that the geometric mean of the first pole and the second pole is substantially equal to an approximation of the mechanical frequency. Any residual error due to the error in the approximation of the mechanical frequency can be compensated or trimmed-out by subsequent digital signal processing. Making the center of the band-pass filter response approximately equal to the geometric mean of the high-pass and low-pass poles can result in the phase delay through the system to be ideally zero. Further, a center frequency of the band-pass filter response can track the mechanical frequency so that the phase delay is less sensitive to fluctuations in the mechanical frequency.

Figure 2:
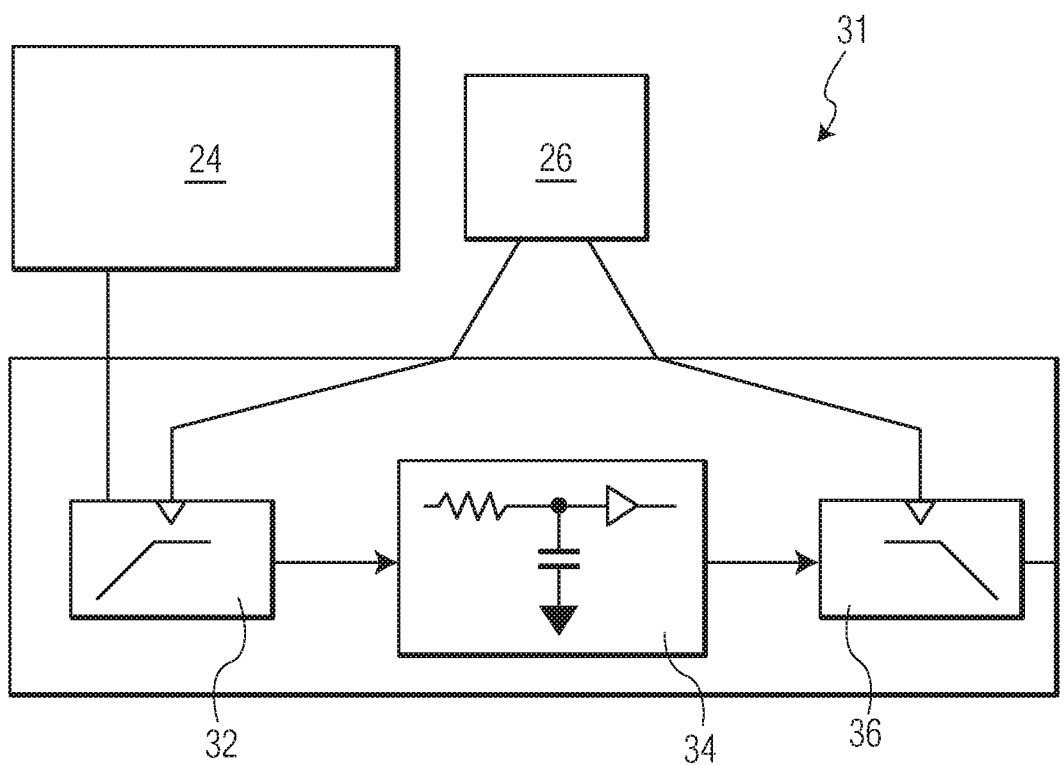
FIG. 2 is a schematic diagram of capacitance-to-voltage interface circuit, in accordance with an example embodiment.

FIG. 2 is a schematic diagram showing the capacitance-to-voltage interface circuit 31, in accordance with an example embodiment. As shown in FIG. 2, in some embodiments the filter component 28 can include a high-pass filter 32, an anti-aliasing filter 34, and a low-pass filter 36. The combination of the high-pass filter 32 and the low-pass filter 36 can create the overall band-pass filter response. For example, the high-pass filter 32 can provide a high-pass cut-off frequency that forms the first pole of the band-pass filter response and the low-pass filter 36 can provide a low-pass cut-off frequency that forms the second pole of the band-pass filter response.

In some embodiments, the one or more clock signals generated by the clock generator 26 can include a high-pass clock signal configured to set a high-pass discrete-time sampling rate for the high-pass filter to be a function of the mechanical frequency. The one or more clock signals can also include a low-pass clock signal configured to set a low-pass discrete-time sampling rate for the low-pass filter to be a function of the mechanical frequency. In some embodiments, the high-pass discrete-time sampling rate can be approximately $64*(f_d)$ and the low-pass discrete-time sampling rate can be approximately $128*(f_d)$. In some embodiments, the high-pass discrete-time sampling rate can be approximately 1.28 MHz and the low-pass discrete-time sampling rate can be approximately 2.56 MHz.

When the high-pass discrete-time sampling rate is applied to the high-pass filter 32, components of the high-pass filter 32 can be configured to drive the high-pass cut-off frequency equal to a result of the mechanical frequency divided by a band-pass filter pole ratio constant (e.g., $f_d/k$) and, when the low-pass discrete-time sampling rate is applied to the low-pass filter 36, components of the low-pass filter 36 can be configured to drive the low-pass cut-off frequency equal to a result of the mechanical frequency multiplied by the band-pass filter pole ratio constant (e.g., $f_d*k$). In some embodiments, the band-pass filter pole ratio constant (k) can be approximately 8, the high-pass cut-off frequency can be approximately 2.5 kHz, and the low-pass cut-off frequency can be approximately 160 kHz.

In some embodiments, the anti-aliasing filter 34 can be a continuous-time anti-aliasing filter. In some embodiments the anti-aliasing filter 34 can be omitted. The anti-aliasing filter 34 can be configured to limit a bandwidth of electrical noise and attenuate interference in an output from the high-pass filter 32 before sampling of the signal by the low-pass filter 36 and any potential in-band aliasing. Any phase error added to the overall transfer function by the anti-aliasing filter 34 can limit the minimum practical bandwidth and the minimum sampling frequency of the low-pass filter 36. In some embodiments, the cut-off frequency for the anti-aliasing filter 34 can be approximately 1.28 MHz.

Referring back to FIG. 1, in some embodiments, the analog-to-digital converter 30 can be electrically coupled to an output of the low-pass filter 36. In such embodiments, the one or more clock signals can include an ADC clock signal configured to set an ADC discrete-time sampling rate for the analog-to-digital converter 30 to be equal to a result of the mechanical frequency multiplied by an ADC sampling constant (e.g., $ADC*f_d$). In some embodiments, the ADC sampling constant can be approximately 8. In some embodiments, the ADC sampling rate can be approximately 160 kHz. In some embodiments, the components of the high-pass filter 32 and the components of the low-pass filter 36 can be configured to result in the band-pass filter pole ratio constant being a same value as the ADC sampling constant. In some embodiments, demodulation can occur in the digital domain after the sampling by the analog-to-digital converter 30. In some embodiments, the capacitance-to-voltage interface circuit 31 can produce a phase error on the demodulated signal of zero or small enough such that phase error variation over temperature is acceptable.

Figure 3:
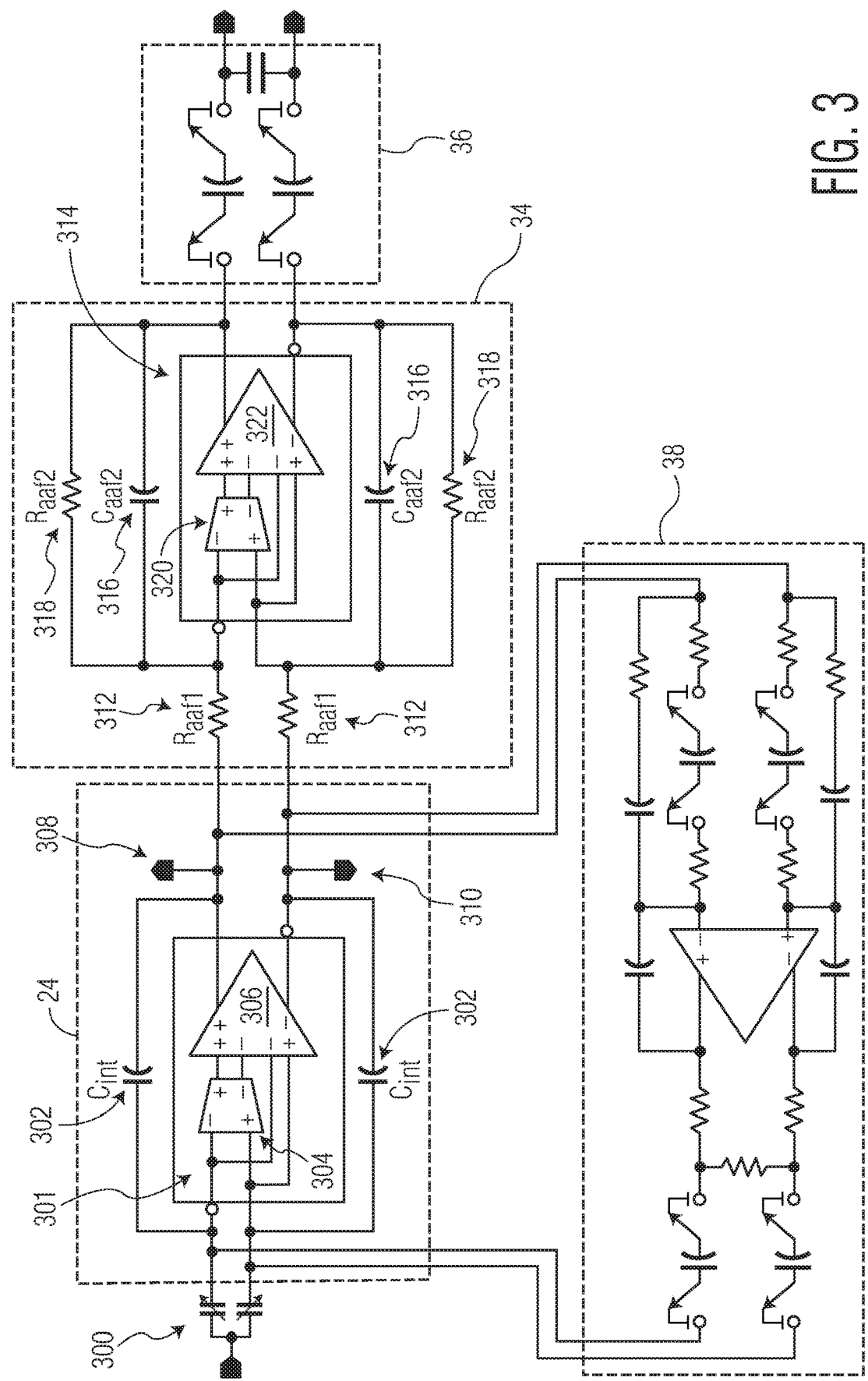
FIG. 3 is a schematic diagram representing some of the internal components of the capacitance-to-voltage interface circuit of FIG. 2, in accordance with an example embodiment.

FIG. 3 is a schematic diagram of an embodiment of the capacitance-to-voltage interface circuit 31. As shown in FIG. 3, in some embodiments the capacitance-to-voltage interface circuit 31 can include the capacitance-to-voltage converter 24, the anti-aliasing filter 34, the low-pass filter 36, and a DC feedback circuit 38. The DC feedback circuit 38 can work together with the capacitance-to-voltage converter 24 to generate the high-pass filter response of the high-pass filter 32 of FIG. 2. As shown in FIG. 3, in some embodiments, the capacitance-to-voltage converter 24 can receive a variable capacitance signal 300 and can include a continuous-time gain stage 301 implemented with a capacitor feedback stage including feedback capacitors 302 (e.g., $C_{int}$). In some embodiments, the continuous-time gain stage 301 can include a first amplifier component 304 and a second amplifier component 306. The first amplifier component 304 can include a negative input coupled to an inverted input of the continuous-time gain stage 301 and a positive input coupled to a non-inverted input of the continuous-time gain stage 301. A positive output of the first amplifier component 304 can be coupled to a first positive input of the second amplifier component 306. A negative output of the first amplifier component 304 can be coupled to a first negative input of the second amplifier component 306. The inverted input of the continuous-time gain stage 301 can be coupled to a second negative input of the second amplifier component 306. The non-inverted input of the continuous-time gain stage 301 can be coupled to a second positive input of the second amplifier component 306. In some embodiments, the continuous-time gain stage 301 can be implemented using a single stage amplifier as known in the art. As shown in FIG. 3, one of the feedback capacitors 302 can be coupled between a non-inverted output of the continuous-time gain stage 301 and the inverted input of the continuous-time gain stage 301. The other one of the feedback capacitors 302 can be coupled between an inverted output of the continuous-time gain stage 301 and the non-inverted input of the continuous-time gain stage 301.

In operation, when the variable capacitance signal 300 is applied to the continuous-time gain stage 301, the first and second amplifier components 304 and 306 operate to produce a voltage output signal 308 (e.g., $V_{c2v+}$) on the non-inverted output and a voltage output signal 310 (e.g., $V_{c2v-}$) on the inverted output, which together represent the raw voltage signal as described herein. For example, the first positive input and the first negative input of the second amplifier component 306 can produce a positive output of the second amplifier component 306 which is equivalent to the voltage output signal 308. The second positive input and the second negative input of the second amplifier component 306 can produce a negative output of the second amplifier component 306 which is equivalent to the inverse of the voltage output signal 310. The voltage output signals 308 and 310 can be fed into the high-pass filter 32.

As shown in FIG. 3, the DC feedback circuit 38 can include a switched-capacitor integrator 402 (see FIG. 4) electrically coupled in a path parallel with the capacitor feedback stage and configured to feedback low-frequency signals output from the continuous-time gain stage 301 to an input of the capacitance-to-voltage converter 24 to remove output offset and create the high-pass frequency response of the high-pass filter 32 of FIG. 2 operating at the high-pass cut-off frequency.

As shown in FIG. 3, the anti-aliasing filter 34 can include input resistors 312 (e.g., $R_{aaf1}$), a continuous-time gain stage 314, feedback capacitors 316 (e.g., $C_{aaf2}$), and feedback resistors 318 (e.g., $R_{aaf2}$). The continuous-time gain stage 314 can be similar to the continuous-time gain stage 301 and can include a first amplifier component 320 and a second amplifier component 322. For example, the first amplifier component 320 can include a negative input coupled to an inverted input of the continuous-time gain stage 314 and a positive input coupled to a non-inverted input of the continuous-time gain stage 314. A positive output of the first amplifier component 320 can be coupled to a first positive input of the second amplifier component 322. A negative output of the first amplifier component 320 can be coupled to a first negative input of the second amplifier component 322. The inverted input of the continuous time gain stage 314 can be coupled to a second negative input of the second amplifier component 322. The non-inverted input of the continuous-time gain stage 314 can be coupled to a second positive input of the second amplifier component 322. Similar to the continuous-time gain stage 301, in some embodiments, the continuous-time gain stage 314 can be implemented using a single stage amplifier as known in the art. As shown in FIG. 3, one of the feedback capacitors 316 in parallel with one of the feedback resistors 318 can be coupled between a non-inverted output of the continuous-time gain stage 314 and the inverted input of the continuous-time gain stage 314. The other one of the feedback capacitors 316 in parallel with the other one of the feedback resistors 318 can be coupled between an inverted output of the continuous-time gain stage 314 and the non-inverted input of the continuous-time gain stage 314.

In operation, the voltage output signals 308 and 310 as modified by the DC feedback circuit 38 can be input into the input resistors 312. Then, the combination of the continuous-time gain stage 314, the feedback capacitors 316, and the feedback resistors 318 can modify the input signals to limit a bandwidth of any electrical noise and attenuate any interference added to the voltage output signals 308 and 310 from the high-pass filter 32 before any potential in-band aliasing and sampling of the signal by the low-pass filter 30.

As shown in FIG. 3, the inverted and non-inverted outputs of the anti-aliasing filter 34 can be received by the low-pass filter 36. The low-pass filter 36 can include a passive switched capacitor low-pass filter configured to create a low-pass frequency response, operating at the low-pass cut-off frequency, for any signals output on the inverted and non-inverted outputs of the anti-aliasing filter 34.

Figure 4:
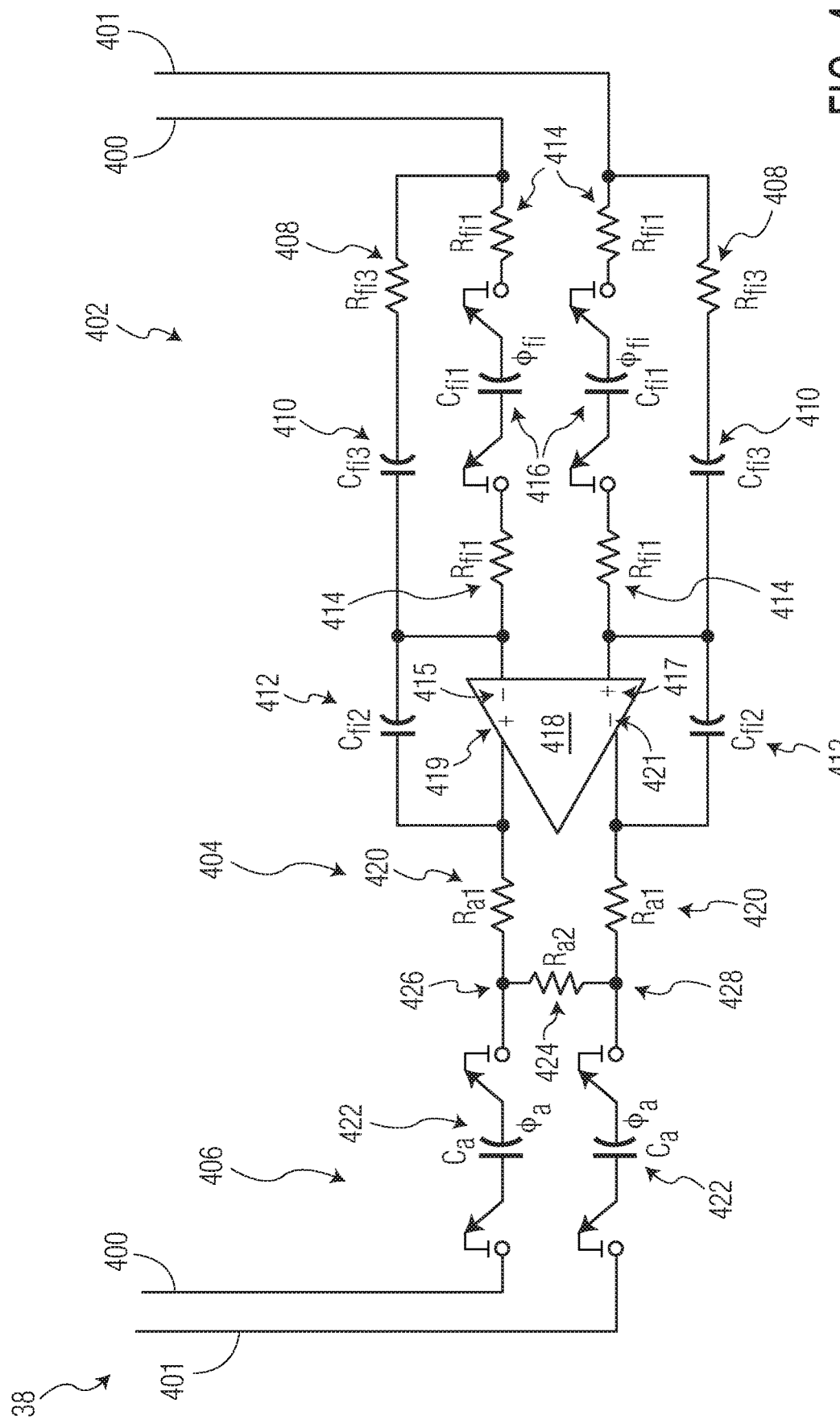
FIG. 4 is a schematic diagram representing a DC feedback circuit of the capacitance-to-voltage interface circuit of FIG. 3, in accordance with an example embodiment.

FIG. 4 is a schematic diagram of the DC feedback circuit 38, in accordance with an example embodiment. As shown in FIG. 4, the DC feedback circuit 38 can include the switched-capacitor integrator 402, an attenuator 404, and a voltage-to-current converter 406. The switched-capacitor integrator 402 can include, resistors 408 (e.g., $R_{fi3}$) capacitors 410 (e.g., $C_{fi3}$), capacitors 412 (e.g., $C_{fi2}$), resistors 414 (e.g., $R_{fi1}$), switching capacitors 416 (e.g., $C_{fi1}$) that switch at a frequency $f_{\phi_{fi}}$, and an operational amplifier 418. In some embodiments, the frequency $f_{\phi_{fi}}$ can be set by the clock generator 26 to be approximately $2*(f_d)$ (e.g., 2 times the mechanical frequency of the capacitive device 22). The attenuator 404 can be an attenuation stage and can include resistors 420 (e.g., $R_{a1}$) and a resistor 424 (e.g., $R_{a2}$). The voltage-to-current converter 406 can include switching capacitors 422 (e.g., $C_a$) that switch at a frequency $f_{\phi_a}$. In some embodiments, the frequency $f_{\phi_a}$ can be set by the clock generator 26 (see FIG. 1) to be approximately $64*(f_d)$ (e.g., 64 times the mechanical frequency of the capacitive device 22).

As shown in FIG. 4, the DC feedback circuit 38 can implement the switched-capacitor integrator 402, the attenuator 404, and the voltage-to-current converter 406, using a first feedback path 400 coupled between the non-inverted output and the inverted input of the continuous-time gain stage 301 and a second feedback path 401 parallel to the first feedback path 400 and coupled between the inverted output and the non-inverted input of the continuous-time gain stage 301. (See FIG. 3). The first feedback path 400 can include one of the resistors 408 in series with one of the capacitors 410 between the non-inverted output of the continuous-time gain stage 301 and a negative input 415 of the operational amplifier 418. That series combination can be in parallel with another series combination that includes one of the switching capacitors 416 coupled in series between two of the resistors 414. One of the capacitors 412 can be coupled between the negative input 415 and a positive output 419 of the operational amplifier 418. One of the resistors 420 can be coupled to the positive output 419 and a node 426. One of the switching capacitors 422 can be coupled between the node 426 and the inverted input of the continuous-time gain stage 301.

As shown in FIG. 4, the second feedback path 401 can be similar to the first feedback path 400 with only a few differences. For example, the second feedback path 401 can include the other one of the resistors 408 in series with the other one of the capacitors 410 between the inverted output of the continuous-time gain stage 301 and a positive input 417 of the operational amplifier 418. That series combination can be in parallel with another series combination that includes the other one of the switching capacitors 416 coupled in series between the other two of the resistors 414. The other one of the capacitors 412 can be coupled between the positive input 417 and a negative output 421 of the operational amplifier 418. The other one of the resistors 420 can be coupled to the negative output 421 and a node 428. The other one of the switching capacitors 422 can be coupled between the node 428 and the non-inverted input of the continuous-time gain stage 301. The resistor 424 can be coupled between the first feedback path 400 and the second feedback path 401 between the node 426 and the node 428.

Figure 5:
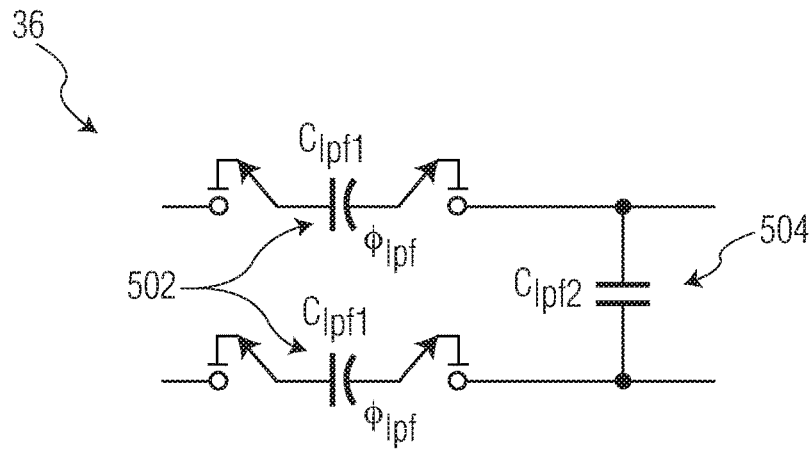
FIG. 5 is a schematic diagram representing a low-pass filter of the capacitance-to-voltage interface circuit of FIG. 3, in accordance with an example embodiment.

FIG. 5 is a schematic diagram of the low-pass filter 36, in accordance with an example embodiment. As shown in FIG. 5, the low-pass filter 36 can include switching capacitors 502 (e.g., $C_{lpf1}$) that switch at a frequency $f_{\phi_{lpf}}$ (e.g., the low-pass discrete-time sampling rate) and a capacitor 504 (e.g., $C_{lpf2}$) coupled between a respective output node of each of the switching capacitors 502. An input node of one of the switching capacitors 502 can be coupled to the non-inverted output of the anti-aliasing filter 34 and an input node of the other switching capacitors 502 can be coupled to the inverted output of the anti-aliasing filter 34. (See FIG. 3).

Figure 6:
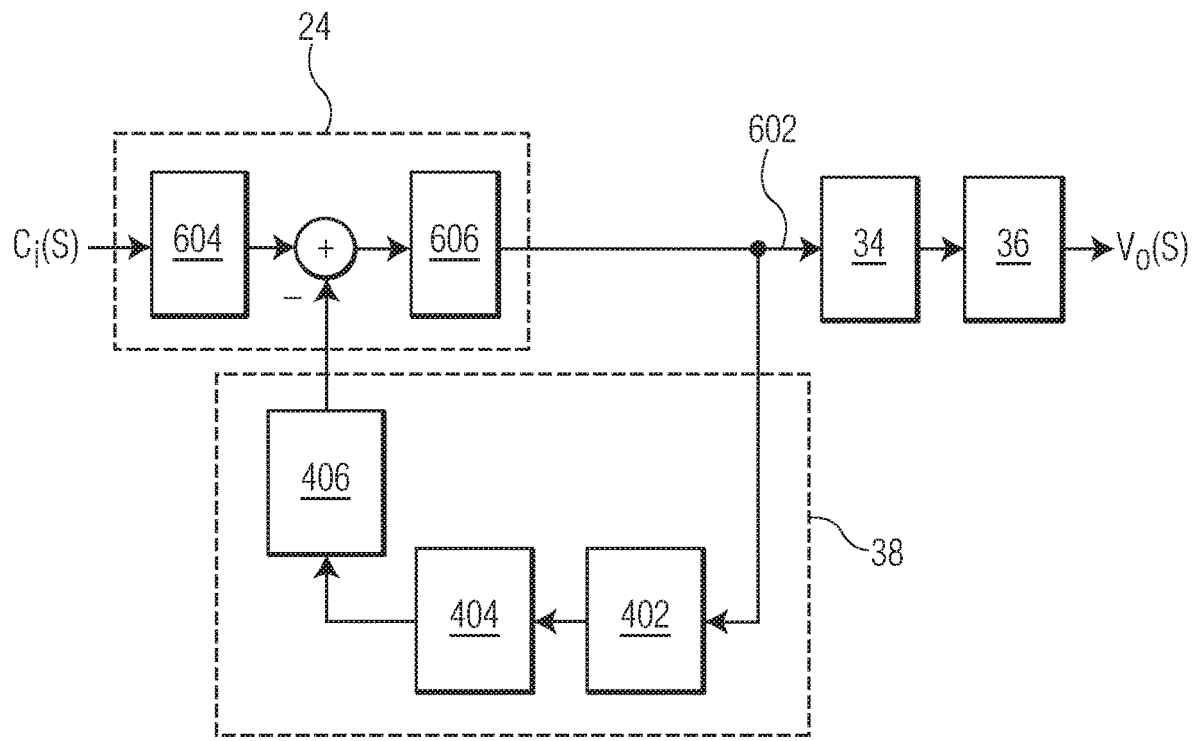
FIG. 6 is an S-Domain representation of some of the components of the capacitance-to-voltage interface circuit of FIG. 3, in accordance with an example embodiment.

FIG. 6 is an S-Domain (e.g., the Laplace-Domain) representation of the capacitance-to-voltage converter 24, the DC feedback circuit 38, the anti-aliasing filter 34, and the low-pass filter 36 of FIG. 3, in accordance with an example embodiment. In the S-Domain, the capacitance-to-voltage converter 24 is represented as a gain stage having a gain $G_{c2v}$. In some embodiments, $G_{c2v}$ can be equivalent to $$\frac{V_x}{C_{int}}.$$

In such embodiments, $V_x$ represents a voltage potential applied across the capacitive device 22 so that a charge is generated when the capacitance value changes (e.g., an excitation voltage) and $C_{int}$ represents a value of the feedback capacitors 302 of the capacitance-to-voltage converter 24. As shown in FIG. 6, a capacitive signal $C_i(s)$ is input into the capacitance-to-voltage converter 24 and is converted by the combination of the capacitance-to-voltage converter 24 and DC feedback circuit 38 into a voltage signal 602 that has been processed with the high-pass filter response as described herein. The voltage signal 602 can be further processed by, the anti-aliasing filter 34 and the low-pass filter 36 to output a band limited voltage signal $V_o(s)$. For simplicity, the anti-aliasing filter 34 can be represented as a simple gain stage having a gain of $G_{aaf}$.

In some embodiments, the capacitance-to-voltage converter 24 can be represented by a first component 604 and a second component 606 in the S-Domain. The transfer function for the first component 604 can be $sV_x$ and the transfer function for the second component 606 can be $$\frac{1}{sC_{int}},$$

so that when combined together with the DC feedback circuit 38, the capacitance-to-voltage converter 24 can produce the gain $G_{c2v}$. In particular, as shown in FIG. 6, the capacitance-to-voltage converter 24 can process the capacitive signal $C_i(s)$ with the first component 604, combine the result with an output of the DC feedback circuit 38, and process the combined result with the second component 606 to produce the voltage signal 602.

In some embodiments, in the S-Domain, the switched-capacitor integrator 402 of the DC feedback circuit 38 can be represented by the transfer function $H_{402}$ as shown in Equation 1 below. The attenuator 404 of the DC feedback circuit 38 can be represented as a gain stage $G_a$ and the voltage-to-current converter 406 of the DC feedback circuit 38 can be represented as $$\frac{1}{R_a}.$$

The value of $\omega_{fi}$ and $\omega_z$ used in the switched-capacitor integrator 402 can be dependent on the values of the resistors 408 and 414; capacitors 410 and 412; the switching capacitors 416; and the frequency $f_{\phi_{fi}}$. Specifically, $\omega_{fi}$ can be defined by Equation 2 below and $\omega_z$ can be defined by Equation 3a below. Equation 3a can be simplified to Equation 3b below which can be approximate as Equation 3c below. In some embodiments, the frequency $f_{\phi_{fi}}$, the value of the capacitor 410 and the capacitor 416 can be configured to produce a zero value at $\omega_z$ for increased stability of the capacitance-to-voltage conversion and amplification system 20 (See. FIG. 1).

$$H_{402} = \frac{\omega_{fi}\left(1 + \frac{s}{\omega_Z}\right)}{s} \quad \text{Equation 1}$$

$$\omega_{fi} = \frac{1}{\left(2R_{fi1} + \frac{1}{f_{\phi_{fi}}C_{fi1}}\right)C_{fi2}} \quad \text{Equation 2}$$

$$\omega_Z = \frac{1}{\left(2R_{fi1} + \frac{1}{f_{\phi_{fi}}C_{fi1}}\right)C_{fi3}} \quad \text{Equation 3a}$$

$$\omega_Z = \frac{f_{\phi_{fi}}\frac{C_{fi1}}{C_{fi3}}}{2f_{\phi_{fi}}R_{fi1}C_{fi1} + 1} \quad \text{Equation 3b}$$

-continued $$\omega_Z \approx f_{\phi_{fi}} \frac{C_{fi1}}{C_{fi3}} \qquad \text{Equation 3c}$$

In some embodiments, in the S-Domain, the gain $G_a$ of the attenuator 404 can be dependent on a resistance value of the resistors 420 and 424. Specifically, in some embodiments, the gain $G_a$ can be defined by Equation 4a below. Equation 4a can be approximated by Equation 4b below. In some embodiments, $G_a$ may take on values of ⅕ or 1/10 or any suitable value less than 1. Additionally, in some embodiments, $R_a$ as used in the voltage-to-current converter 406 can be defined be equation 5 below.

$$G_a = \frac{R_a R_{a2}}{R_{a1} R_{a2} + 2R_a R_{a1} + R_a R_{a2}} \qquad \text{Equation 4a}$$

$$G_a \approx \frac{R_{a2}}{2R_{a1} + R_{a2}} \qquad \text{Equation 4b}$$

$$R_a = \frac{1}{f_{\phi_a} C_a} \qquad \text{Equation 5}$$

Using the equations presented above, the high-pass pole $\omega_{hp}$ (e.g., the high-pass cut-off frequency of the high-pass filter 32 as implemented by the DC feedback circuit 38) can be approximated by Equation 7a below, which makes the high-pass pole $\omega_{hp}$ approximately dependent on the values of the feedback capacitors 302; the capacitors 410 and 412; the switching capacitors 422; the resistors 420 and 424, and the frequency $f_{\phi_a}$. More generally, the high-pass pole $\omega_{hp}$ can approximately depend on factors equal to ratios between various ones of the respective values of the feedback capacitors 302, the capacitors 410 and 412, and the switching capacitors 422, a factor equal to a ratio of the respective values of the resistors 420 and 424, and a frequency factor. As discussed above, in some embodiments the clock generator 26 can generate the frequency $f_{\phi_a}$ to be a function of the mechanical frequency $f_d$ of the capacitive device 22 (See FIG. 1). In such embodiments, the equation representing the high-pass pole $\omega_{hp}$ can be simplified as shown in Equations 6b, 6c, 6d, 6e, and 6f below where $k_{\phi,a}$ is a constant multiplier applied to $f_d$ to derive $f_{\phi_a}$, the value of k is constant, $\omega_{hp}$ is in units of radians per second, $f_d$ has units of 1/seconds (e.g., Hz), and $2\pi$ is the conversion factor between the two units. This configuration allows $\omega_{hp}$ to track $f_d$.

$$\omega_{hp} \approx f_{\phi_a} \frac{C_a}{C_{int}} \frac{C_{fi3}}{C_{fi2}} G_a \qquad \text{Equation 6a}$$

$$\omega_{hp} \approx (f_d k_{\phi,a}) \left(\frac{C_a}{C_{int}}\right) \left(\frac{C_{fi3}}{C_{fi2}}\right) G_a \qquad \text{Equation 6b}$$

$$\frac{C_{fi3}}{C_{fi2}} = k_{fi} \qquad \text{Equation 6c}$$

$$\omega_{hp} \approx f_d k_{fi} k_{\phi,a} G_a \frac{C_a}{C_{int}} \qquad \text{Equation 6d}$$

$$\frac{2\pi}{k_{fi} k_{\phi,a} G_a \frac{C_a}{C_{int}}} = k \qquad \text{Equation 6e}$$

$$\omega_{hp} \approx \frac{2\pi f_d}{k} \qquad \text{Equation 6f}$$

In some embodiments, in the S-Domain, the low-pass filter 36 can be represented by the transfer function $H_{36}$ as shown in Equation 7 below. In such embodiments, $k\omega_d$ (e.g., the product of the band-pass filter pole ratio constant and the geometric mean of the high-pass pole $\omega_{hp}$ and the low-pass pole $\omega_{lp}$) can be a function of values of the switching capacitors 502; the frequency $f_{lpf}$ (e.g., the low-pass discrete-time sampling rate); the capacitor 504, and an input capacitance of a next stage (not shown) represented by $C_{\alpha_1}$. Specifically, $k\omega_d$ can be defined by Equation 8 below. Using these equations, the low-pass pole $\omega_{lp}$ (e.g., the low-pass cut-off frequency of the low-pass filter 36) can be defined by Equation 9a below, which makes the low-pass pole $\omega_{lp}$ dependent on the values of the switching capacitors 502; the frequency $f_{\phi_{lpf}}$ (e.g., the low-pass discrete-time sampling rate); the capacitor 504, and the input capacitance $C_{\alpha_1}$. As discussed above, in some embodiments the clock generator 26 can generate the frequency $f_{\phi_{lpf}}$ to be a function of the mechanical frequency $f_d$ of the capacitive device 22. In such embodiments, the equation representing the low-pass pole $\omega_{lp}$ can be simplified as shown in Equations 9b, 9c, and 9d below. While the low-pass pole $\omega_{lp}$ is related to the same constant k as the high-pass pole $\omega_{hp}$, the value of the constant k for each of the DC feedback circuit 38 and the low-pass filter 36 are constructed using different elements, as described herein. For example, resistor ratios, capacitor ratios, and fixed frequency scalers of the respective components of the DC feedback circuit 38 and the low-pass filter 36 may differ. The geometric mean of the high-pass pole and low-pass pole can be defined by Equation 10 below.

$$H_{36} = \frac{1}{\frac{s}{k\omega_d} + 1} \qquad \text{Equation 7}$$

$$k\omega_d = \omega_{lp} = \frac{1}{\left(\frac{1}{f_{\phi_{lpf}} C_{lpf1}}\right)(C_{lpf2} + C_{\alpha_1})} \qquad \text{Equation 8}$$

$$\omega_{lp} = f_{\phi_{lpf}} \frac{C_{lpf1}}{C_{lpf2} + C_{\alpha_1}} \qquad \text{Equation 9a}$$

$$\omega_{lp} = f_d k_{\phi,lpf} \frac{C_{lpf1}}{C_{lpf2} + C_{\alpha_1}} \qquad \text{Equation 9b}$$

$$\frac{2\pi}{k_{fi} k_{\phi,a} G_a \frac{C_a}{C_{int}}} = k \qquad \text{Equation 9c}$$

$$\omega_{lp} = 2\pi f_d k \qquad \text{Equation 9d:}$$

$$\sqrt{\omega_{hp} \omega_{lp}} = \sqrt{(2\pi f_d/k)(2\pi f_d k)} = 2\pi f_d = \omega_d \qquad \text{Equation 10:}$$

Figure 7:
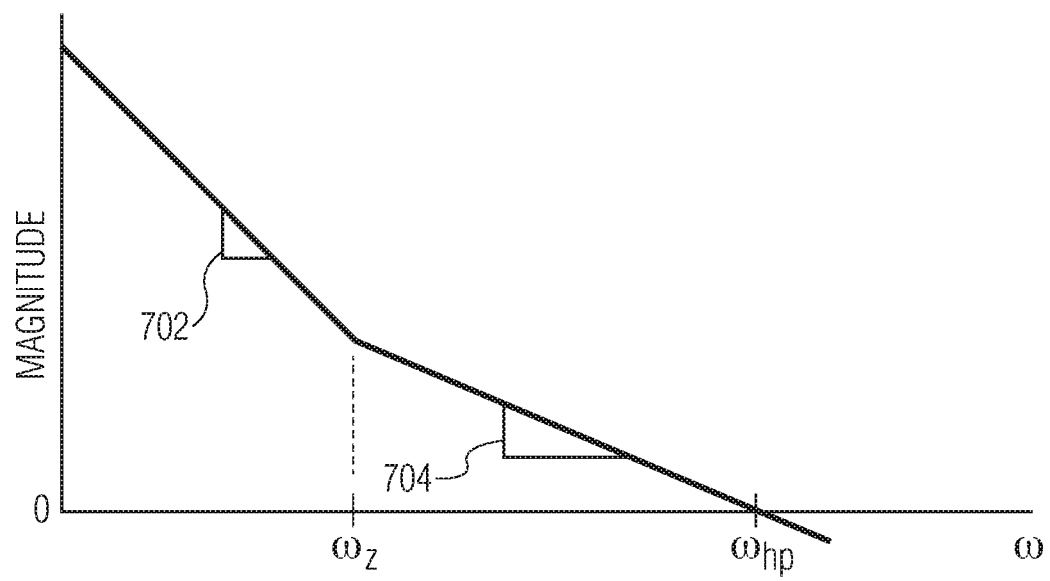
FIG. 7 is a graph showing the loop gain of capacitance-to-voltage interface circuit of FIG. 3, in accordance with an example embodiment.

FIG. 7 is a graph showing the loop gain of the capacitance-to-voltage interface circuit 32, in accordance with an example embodiment. As shown in FIG. 7, the loop gain can have a slope 702 between $\omega=0$ and $\omega=\omega_z$ and a slope 704 between $\omega=\omega_z$ and $\omega=\omega_{hp}$. In some embodiments, the slope 702 can be −40 dB/dec and the slope 704 can be −20 dB/dec.

Figure 8:
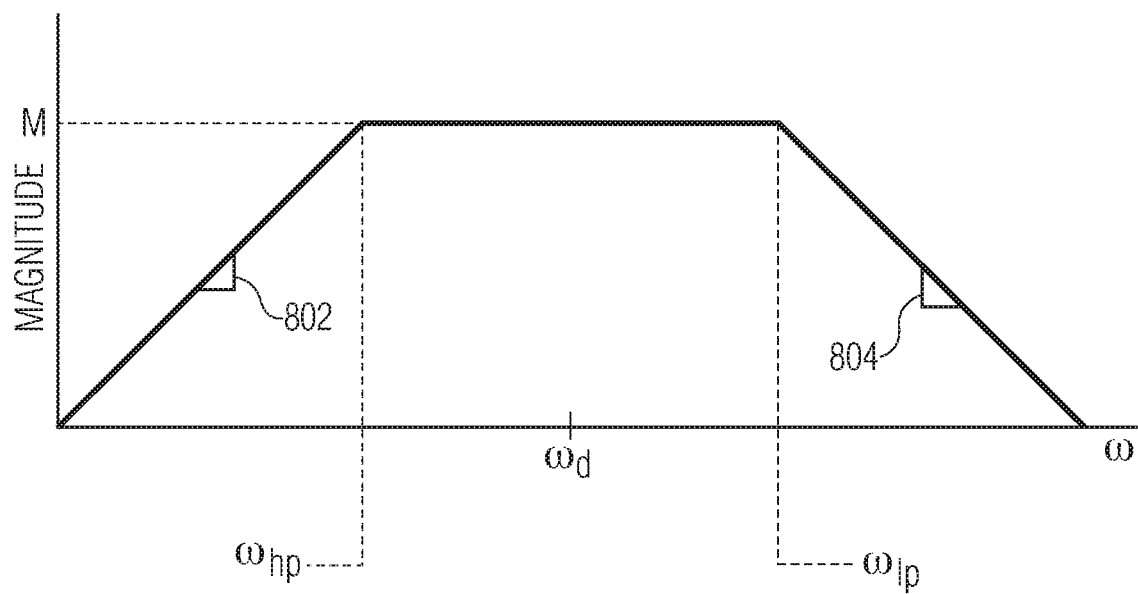
FIG. 8 is a bode diagram showing the complete transfer function of the capacitance-to-voltage interface circuit of FIG. 3, in accordance with an example embodiment.

FIG. 8 is a bode diagram showing the complete transfer function of the capacitance-to-voltage interface circuit 31, in accordance with an example embodiment. As shown in FIG. 7, the transfer function can have a slope 802 between $\omega=0$ and $\omega=\omega_{lp}$, a magnitude M between $\omega=\omega_{hp}$ and $\omega=\omega_{lp}$, and a slope 804 when $\omega>\omega_{lp}$. In some embodiments, the slope 802 can be 20 dB/dec, the slope 804 can be −20 dB/dec, and the magnitude M can be approximately $G_{c2}, G_{aaf}$.

Additionally, in at least some embodiments, the present disclosure additionally relates to a capacitance-to-voltage interface circuit that includes a capacitance-to-voltage converter configured to convert a capacitive signal from a capacitive device that operates at a mechanical frequency into a raw voltage signal. The circuit can also include a clock generator configured to electrically couple to the capacitive device and convert the mechanical frequency into one or more clock signals. The circuit can also include a filter component electrically coupled to the capacitance-to-voltage converter and the clock generator. The filter component can be configured to apply a band-pass filter response to the raw voltage signal to convert the raw voltage signal into a band-limited voltage signal. The clock generator can be configured to apply the one or more clock signals to the filter component to drive a first pole and a second pole of the band-pass filter response to track the mechanical frequency of the capacitive device such that the geometric mean of the first pole and the second pole is substantially equal to the mechanical frequency.

In some embodiments, the filter component can include a high-pass filter that operates at a high-pass cut-off frequency to form the first pole of the band-pass filter response and a low-pass filter that operates at a low-pass cut-off frequency to form the second pole of the band-pass filter response. In such embodiments, the one or more clock signals can include a high-pass clock signal configured to set a high-pass discrete-time sampling rate for the high-pass filter to be a function of the mechanical frequency. The one or more clock signals can also include a low-pass clock signal configured to set a low-pass discrete-time sampling rate for the low-pass filter to be a function of the mechanical frequency. When the high-pass discrete-time sampling rate is applied to the high-pass filter, components of the high-pass filter can be configured to drive the high-pass cut-off frequency equal to a result of the mechanical frequency divided by a band-pass filter pole ratio constant. When the low-pass discrete-time sampling rate is applied to the low-pass filter, components of the low-pass filter can be configured to drive the low-pass cut-off frequency equal to a result of the mechanical frequency multiplied by the band-pass filter pole ratio constant.

Additionally, in at least some embodiments, the present disclosure additionally relates to a method. The method can include a capacitance-to-voltage converter converting a capacitive signal from a capacitive device that operates at a mechanical frequency into a raw voltage signal. The method can also include a clock generator electrically coupled to the capacitive device converting the mechanical frequency into one or more clock signals. The method can also include a filter component electrically coupled to the capacitance-to-voltage converter and the clock generator applying a band-pass filter response to the raw voltage signal to convert the raw voltage signal into a band-limited voltage signal. The method can also include the clock generator applying the one or more clock signals to the filter component to drive a first pole and a second pole of the band-pass filter response to track the mechanical frequency of the capacitive device such that the geometric mean of the first pole and the second pole is substantially equal to the mechanical frequency.

In some embodiments, the method can include a high-pass filter of the filter component operating at a high-pass cut-off frequency to form the first pole of the band-pass filter response. The method can also include a low-pass filter of the filter component operating at a low-pass cut-off frequency to form the second pole of the band-pass filter response. The method can also include a high-pass clock signal of the one or more clock signals setting a high-pass discrete-time sampling rate for the high-pass filter to be a function of the mechanical frequency. The method can also include a low-pass clock signal of the one or more clock signals setting a low-pass discrete-time sampling rate for the low-pass filter to be a function of the mechanical frequency. When the high-pass discrete-time sampling rate is applied to the high-pass filter, the method can also include components of the high-pass filter driving the high-pass cut-off frequency equal to a result of the mechanical frequency divided by a band-pass filter pole ratio constant. When the low-pass discrete-time sampling rate is applied to the low-pass filter, the method can also include components of the low-pass filter driving the low-pass cut-off frequency equal to a result of the mechanical frequency multiplied by the band-pass filter pole ratio constant.

Additionally, in at least some embodiments, the present disclosure additionally relates to a system that includes a capacitive device that operates at a mechanical frequency and outputs a capacitive signal. The system can also include a capacitance-to-voltage converter electrically coupled to the capacitive device and configured to convert the capacitive signal into a raw voltage signal. The circuit can also include a clock generator electrically coupled to the capacitive device and configured to convert the mechanical frequency into one or more clock signals. The system can also include a filter component electrically coupled to the capacitance-to-voltage converter and the clock generator and configured to apply a band-pass filter response to the raw voltage signal to convert the raw voltage signal into a band-limited voltage signal. The system can also include an analog-to-digital converter electrically coupled to an output of the filter component and the clock generator that down samples the band-limited voltage signal for later digital signal processing. The clock generator can be configured to apply the one or more clock signals to the filter component to drive a first pole and a second pole of the band-pass filter response to track the mechanical frequency of the capacitive device such that the geometric mean of the first pole and the second pole is substantially equal to the mechanical frequency.

In some embodiments the filter component can include a high-pass filter that operates at a high-pass cut-off frequency to form the first pole of the band-pass filter response and a low-pass filter that operates at a low-pass cut-off frequency to form the second pole of the band-pass filter response. In such embodiments an output of the low-pass filter can be the output of the filter component. The one or more clock signals can include a high-pass clock signal configured to set a high-pass discrete-time sampling rate for the high-pass filter to be a function of the mechanical frequency. The one or more clock signals can also include a low-pass clock signal configured to set a low-pass discrete-time sampling rate for the low-pass filter to be a function of the mechanical frequency. The one or more clock signals can also include an ADC clock signal configured to set an ADC discrete-time sampling rate for the analog-to-digital converter to be equal to a result of the mechanical frequency multiplied by an ADC sampling constant. When the high-pass discrete-time sampling rate is applied to the high-pass filter, components of the high-pass filter can be configured to drive the high-pass cut-off frequency equal to a result of the mechanical frequency divided by a band-pass filter pole ratio constant. When the low-pass discrete-time sampling rate is applied to the low-pass filter, components of the low-pass filter can be configured to drive the low-pass cut-off frequency of the low-pass filter equal to a result of the mechanical frequency multiplied by the band-pass filter pole ratio constant.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

Accordingly, it is specifically intended that the present invention not be limited to the embodiments and illustrations contained herein, but include modified forms of those embodiments including portions of the embodiments and combinations of elements of different embodiments as come within the scope of the following claims.

In one or more embodiments as claimed in the appended method claims:

A. The method further comprises an ADC clock signal of the one or more signals setting an ADC discrete-time sampling rate for an analog-to-digital converter (30) electrically coupled to an output of the low-pass filter (36) to be equal to a result of the mechanical frequency multiplied by an ADC sampling constant.

B. The method of clause A may further comprise selecting the components of the high-pass filter (32) and the components of the low-pass filter (36) to result in the band-pass filter pole ratio constant being a same value as the ADC sampling constant.

C. The method of clause A may further comprise a phase-locked loop component of the clock generator (26) generating the high-pass clock signal, the low-pass clock signal, and the ADC clock signal from the mechanical frequency.

The present disclosure further extends to:

D. A system comprising: a capacitive device that operates at a mechanical frequency and outputs a capacitive signal; a capacitance-to-voltage converter (24) electrically coupled to the capacitive device and configured to convert the capacitive signal into a raw voltage signal;

a clock generator (26) electrically coupled to the capacitive device and configured to convert the mechanical frequency into one or more clock signals;

a filter component 928) electrically coupled to the capacitance-to-voltage converter (24) and the clock generator (26) and configured to apply a band-pass filter response to the raw voltage signal to convert the raw voltage signal into a band-limited voltage signal; and an analog-to-digital converter (30) electrically coupled to an output of the filter component (28) and the clock generator (26) that down samples the band-limited voltage signal for later digital signal processing, wherein the clock generator (26) is configured to apply the one or more clock signals to the filter component (28) to drive a first pole and a second pole of the band-pass filter response to track the mechanical frequency of the capacitive device such that the geometric mean of the first pole and the second pole is substantially equal to the mechanical frequency.

E. The system of clause D, wherein the filter component (28) includes a high-pass filter (32) that operates at a high-pass cut-off frequency to form the first pole of the band-pass filter response and a low-pass filter (36) that operates at a low-pass cut-off frequency to form the second pole of the ban-pass filter response, wherein an output of the low-pass filter (26) is the output of the filter component (28), wherein the one or more clock signals includes a high-pass clock signal configured to set a high-pass discrete-time sampling rate for the high-pass filter (32) to be a function of the mechanical frequency, wherein the one or more clock signals includes a low-pass clock signal configured to set a low-pass discrete-time sampling rate for the low-pass filter (36) to be a function of the mechanical frequency, wherein the one or more clock signals includes an ADC clock signal configured to set an ADC discrete-time sampling rate for the analog-to-digital converter (30) to be equal to a result of the mechanical frequency multiplied by an ADC sampling constant, wherein, when the high-pass discrete-time sampling rate is applied to the high-pass filter (32), components of the high-pass filter (32) are configured to drive the high-pass cut-off frequency equal to a result of the mechanical frequency divided by a band-pass filter pole ratio constant, and wherein, when the low-pass discrete-time sampling rate is applied to the low-pass filter (36), components of the low-pass filter (36) are configured to drive the low-pass cut-off frequency of the low-pass filter (36) equal to a result of the mechanical frequency multiplied by the band-pass filter pole ratio constant.

The invention claimed is:

1. A capacitance-to-voltage interface circuit comprising:

a capacitance-to-voltage converter configured to convert a capacitive signal from a capacitive device that operates at a mechanical frequency into a raw voltage signal;

a clock generator configured to electrically couple to the capacitive device and convert the mechanical frequency into one or more clock signals; and a filter component electrically coupled to the capacitance-to-voltage converter and the clock generator and configured to apply a band-pass filter response to the raw voltage signal to convert the raw voltage signal into a band-limited voltage signal, wherein the clock generator is configured to apply the one or more clock signals to the filter component to drive a first pole and a second pole of the band-pass filter response to track the mechanical frequency of the capacitive device such that the geometric mean of the first pole and the second pole is substantially equal to the mechanical frequency.

2. The capacitance-to-voltage interface circuit of claim 1, wherein the filter component includes a high-pass filter that operates at a high-pass cut-off frequency to form the first pole of the band-pass filter response and a low-pass filter that operates at a low-pass cut-off frequency to form the second pole of the band-pass filter response,
   wherein the one or more clock signals includes a high-pass clock signal configured to set a high-pass discrete-time sampling rate for the high-pass filter to be a function of the mechanical frequency, and
   wherein the one or more clock signals include a low-pass clock signal configured to set a low-pass discrete-time sampling rate for the low-pass filter to be a function of the mechanical frequency.

3. The capacitance-to-voltage interface circuit of claim 2, wherein, when the high-pass discrete-time sampling rate is applied to the high-pass filter, components of the high-pass filter are configured to drive the high-pass cut-off frequency equal to a result of the mechanical frequency divided by a band-pass filter pole ratio constant, and
   wherein, when the low-pass discrete-time sampling rate is applied to the low-pass filter, components of the low-pass filter are configured to drive the low-pass cut-off frequency equal to a result of the mechanical frequency multiplied by the band-pass filter pole ratio constant.

4. The capacitance-to-voltage interface circuit of claim 2, wherein the clock generator is configured to generate the high-pass clock signal and the low-pass clock signal such that the low-pass discrete-time sampling rate is two times greater than the high-pass discrete-time sampling rate.

5. The capacitance-to-voltage interface circuit of claim 3, further comprising an analog-to-digital converter electrically coupled to an output of the low-pass filter and the clock generator,
   wherein the one or more clock signals includes an ADC clock signal configured to set an ADC discrete-time sampling rate for the analog-to-digital converter to be equal to a result of the mechanical frequency multiplied by an ADC sampling constant.

6. The capacitance-to-voltage interface circuit of claim 5, wherein the components of the high-pass filter and the components of the low-pass filter are configured to result in the band-pass filter pole ratio constant being a same value as the ADC sampling constant.

7. The capacitance-to-voltage interface circuit of claim 5, wherein the clock generator includes a phase-locked loop component that generates the high-pass clock signal, the low-pass clock signal, and the ADC clock signal from the mechanical frequency.

8. The capacitance-to-voltage interface circuit of claim 2, wherein the filter component includes a continuous-time domain anti-aliasing filter electrically coupled between the high-pass filter and the low-pass filter, and
   wherein the continuous-time domain anti-aliasing filter is configured to limit a bandwidth of electrical noise and attenuate interference in an output from the high-pass filter before sampling by the low-pass filter.

9. The capacitance-to-voltage interface circuit of claim 2, wherein the capacitance-to-voltage converter includes a continuous-time gain stage implemented with a capacitor feedback stage,
   wherein the high-pass filter includes a switched-capacitor integrator electrically coupled in a path parallel with the capacitor feedback stage and configured to feedback low-frequency signals output from the continuous-time gain stage to an input of the capacitance-to-voltage converter to remove output offset and create a high-pass frequency response operating at the high-pass cut-off frequency, and
   wherein the low-pass filter includes a passive switched capacitor low-pass filter (36) configured to create a low-pass frequency response operating at the low-pass cut-off frequency.

10. A method comprising:
    a capacitance-to-voltage converter converting a capacitive signal from a capacitive device that operates at a mechanical frequency into a raw voltage signal;
    a clock generator electrically coupled to the capacitive device converting the mechanical frequency into one or more clock signals;
    a filter component electrically coupled to the capacitance-to-voltage converter and the clock generator applying a band-pass filter response to the raw voltage signal to convert the raw voltage signal into a band-limited voltage signal; and
    the clock generator applying the one or more clock signals to the filter component to drive a first pole and a second pole of the band-pass filter response to track the mechanical frequency of the capacitive device such that the geometric mean of the first pole and the second pole is substantially equal to the mechanical frequency.

11. The method of claim 10, further comprising:
    a high-pass filter of the filter component operating at a high-pass cut-off frequency to form the first pole of the band-pass filter response;
    a low-pass filter of the filter component operating at a low-pass cut-off frequency to form the second pole of the band-pass filter response;
    a high-pass clock signal of the one or more clock signals setting a high-pass discrete-time sampling rate for the high-pass filter to be a function of the mechanical frequency; and
    a low-pass clock signal of the one or more clock signals setting a low-pass discrete-time sampling rate for the low-pass filter to be a function of the mechanical frequency.

12. The method of claim 11, further comprising:
    when the high-pass discrete-time sampling rate is applied to the high-pass filter, components of the high-pass filter driving the high-pass cut-off frequency equal to a result of the mechanical frequency divided by a band-pass filter pole ratio constant; and
    when the low-pass discrete-time sampling rate is applied to the low-pass filter, components of the low-pass filter driving the low-pass cut-off frequency equal to a result of the mechanical frequency multiplied by the band-pass filter pole ratio constant.

13. The method of claim 12, further comprising an ADC clock signal of the one or more clock signals setting an ADC discrete-time sampling rate for an analog-to-digital converter electrically coupled to an output of the low-pass filter to be equal to a result of the mechanical frequency multiplied by an ADC sampling constant.

14. The method of claim 13, further comprising selecting the components of the high-pass filter and the components of the low-pass filter to result in the band-pass filter pole ratio constant being a same value as the ADC sampling constant.

15. The method of claim 13, further comprising a phase-locked loop component of the clock generator generating the high-pass clock signal, the low-pass clock signal, and the ADC clock signal from the mechanical frequency.

16. The method of claim 11, further comprising the clock generator setting the low-pass discrete-time sampling rate to be two times greater than the high-pass discrete-time sampling rate.

17. The method of claim 11, further comprising a continuous-time domain anti-aliasing filter of the filter component limiting a bandwidth of electrical noise and attenuating interference in an output from the high-pass filter before sampling by the low-pass filter.

18. The method of claim 11, wherein the capacitance-to-voltage converter includes a continuous-time gain stage implemented with a capacitor feedback stage,
    wherein the high-pass filter includes a switched-capacitor integrator electrically coupled in a path parallel with the capacitor feedback stage that feedbacks low-frequency signals output from the continuous-time gain stage to an input of the capacitance-to-voltage converter to remove output offset and create a high-pass frequency response operating at the high-pass cut-off frequency, and
    wherein the low-pass filter includes a passive switched capacitor low-pass filter that creates a low-pass frequency response operating at the low-pass cut-off frequency.

19. A system comprising:
    a capacitive device that operates at a mechanical frequency and outputs a capacitive signal;
    a capacitance-to-voltage converter electrically coupled to the capacitive device and configured to convert the capacitive signal into a raw voltage signal;
    a clock generator electrically coupled to the capacitive device and configured to convert the mechanical frequency into one or more clock signals;
    a filter component electrically coupled to the capacitance-to-voltage converter and the clock generator and configured to apply a band-pass filter response to the raw voltage signal to convert the raw voltage signal into a band-limited voltage signal; and
    an analog-to-digital converter electrically coupled to an output of the filter component and the clock generator that down samples the band-limited voltage signal for later digital signal processing,
    wherein the clock generator is configured to apply the one or more clock signals to the filter component to drive a first pole and a second pole of the band-pass filter response to track the mechanical frequency of the capacitive device such that the geometric mean of the first pole and the second pole is substantially equal to the mechanical frequency.

20. The system of claim 19, wherein the filter component includes a high-pass filter that operates at a high-pass cut-off frequency to form the first pole of the band-pass filter response and a low-pass filter that operates at a low-pass cut-off frequency to form the second pole of the band-pass filter response,
    wherein an output of the low-pass filter is the output of the filter component,
    wherein the one or more clock signals includes a high-pass clock signal configured to set a high-pass discrete-time sampling rate for the high-pass filter to be a function of the mechanical frequency,
    wherein the one or more clock signals includes a low-pass clock signal configured to set a low-pass discrete-time sampling rate for the low-pass filter to be a function of the mechanical frequency,
    wherein the one or more clock signals includes an ADC clock signal configured to set an ADC discrete-time sampling rate for the analog-to-digital converter to be equal to a result of the mechanical frequency multiplied by an ADC sampling constant,
    wherein, when the high-pass discrete-time sampling rate is applied to the high-pass filter, components of the high-pass filter are configured to drive the high-pass cut-off frequency equal to a result of the mechanical frequency divided by a band-pass filter pole ratio constant, and
    wherein, when the low-pass discrete-time sampling rate is applied to the low-pass filter, components of the low-pass filter are configured to drive the low-pass cut-off frequency of the low-pass filter equal to a result of the mechanical frequency multiplied by the band-pass filter pole ratio constant.

* * * * *